US007026210B2

(12) United States Patent
Lai

(10) Patent No.: US 7,026,210 B2
(45) Date of Patent: Apr. 11, 2006

(54) METHOD FOR FORMING A BOTTLE-SHAPED TRENCH

(75) Inventor: Su-Chen Lai, Jiayi (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/730,081

(22) Filed: Dec. 9, 2003

(65) Prior Publication Data

US 2004/0259368 A1 Dec. 23, 2004

(30) Foreign Application Priority Data

Jun. 23, 2003 (TW) .............................. 92116938 A

(51) Int. Cl.
*H01L 21/8242* (2006.01)

(52) U.S. Cl. ...................................... 438/243; 438/386

(58) Field of Classification Search ........ 438/243–249, 438/386–392

See application file for complete search history.

(56) References Cited

U.S. PATENT DOCUMENTS

| | | | | |
|---|---|---|---|---|
| 5,656,097 | A * | 8/1997 | Olesen et al. | 134/1 |
| 5,776,808 | A * | 7/1998 | Muller et al. | 438/243 |
| 6,127,281 | A * | 10/2000 | Sakaguchi et al. | 438/747 |
| 6,398,904 | B1 * | 6/2002 | Heo et al. | 156/345.11 |
| 6,426,250 | B1 * | 7/2002 | Lee et al. | 438/239 |
| 6,716,696 | B1 * | 4/2004 | Chen et al. | 438/243 |
| 6,770,526 | B1 * | 8/2004 | Chudzik et al. | 438/243 |
| 6,777,303 | B1 * | 8/2004 | Schrems et al. | 438/386 |
| 6,828,191 | B1 * | 12/2004 | Wurster et al. | 438/247 |
| 2003/0020110 | A1 * | 1/2003 | Tews et al. | 257/301 |
| 2003/0068867 | A1 * | 4/2003 | Forster et al. | 438/386 |

* cited by examiner

*Primary Examiner*—Jennifer Kennedy
(74) *Attorney, Agent, or Firm*—Birch, Stewart, Kolasch & Birch,LLP

(57) ABSTRACT

The invention provides a method for forming a bottle-shaped trench. A semiconductor substrate having a pad stack layer and a trench formed thereon is provided. Sidewall protective layers are then formed on the upper sidewalls of the trench. A masking layer is formed at the bottom of the trench, followed by wet etching to remove the semiconductor substrate not covered by the sidewall protective layers thus forming a bottle-shaped trench. Finally, the masking layer is removed.

10 Claims, 9 Drawing Sheets

METHOD FOR FORMING A BOTTLE-SHAPED TRENCH

This Nonprovisional application claims priority under 35 U.S.C. § 119(a) on Patent Application No(s). 092116938 filed in TAIWAN on Jun. 23, 2003, the entire contents of which are hereby incorporated by reference.

BACKGROUND OF THE INVENTION

1. Field of the Invention

The present invention relates in general to a semiconductor DRAM (Dynamic Random Access Memory) process. In particular, the present invention relates to a method for forming a bottle-shaped trench.

2. Description of the Related Art

DRAM capacitors generally consist of two electrodes isolated by an insulating material. The electrical charge capability of DRAM is determined by the thickness of the insulating material, the surface area of electrodes and the electrical properties of the insulating material. As ICs become more compact, semiconductor design has reduced device dimensions increasing density to accommodate a large number of memory cells. Conversely, memory cell electrodes must provide sufficient surface area for electrical charge storage.

Under the conditions mentioned above, DRAM trench storage node capacitance is reduced accordingly. Hence, a means of increasing storage capacitance to maintain excellent performance is necessary.

Currently, the preferred method of increasing DRAM storage capacitance is to increase the bottom width of the trench, forming a bottle-shaped capacitor to increase the usable surface area of the trench. Referring to FIGS. 1A~1F, a semiconductor substrate with a trench is first provided, as shown in FIG. 1A, wherein symbol 100 represents the semiconductor substrate, symbol 102 represents the oxide layer, symbol 104 represents the nitride layer, and symbol 106 represents the trench.

Then, in FIG. 1B, a TEOS (Tetra-Ethyl-Ortho-Silicate) layer is formed conformally as a barrier layer 108. Next, in FIG. 1C, a sacrificial layer 110 comprising polysilicon material, is filled in the bottom of the trench. Next, the barrier layer 108 is removed from the nitride layer 104 and the trench sidewalls not covered by sacrificial layer 110. In FIG. 1D, an oxide layer 112' is formed conformally on the surface of the nitride layer 104, the trench sidewalls and the sacrificial layer 110.

Subsequently, in FIG. 1E, the oxide layer 112' covering the nitride layer 104 and the trench bottom is removed by an anisotropic etching to form a collar oxide 112 on the upper sidewalls of the trench, and sacrificial layer 110 is then removed.

Finally, the barrier layer 108 covering the trench bottom is removed using DHF (dilute Hydrofluoric Acid), while the trench sidewalls and semiconductor substrate surface are etched with an $NH_4OH+H_2O$ etching solution forming the bottle-shaped trench, as shown in FIG. 1F.

When viewed in cross-section, the bottle-shaped trench tapers gradually from the top to the bottom of the trench, presenting a bottle shape. Additionally, a collar oxide can be optionally formed on the upper sidewalls of the trench, as shown in FIG. 2E, or be omitted, as shown in FIG. 3E.

In FIG. 1F, when the trench is etched with $NH_4OH+H_2O$ etching solution, due to the structure of semiconductor silicon crystal, awl-shaped structures, represented by symbol A, are easily formed at the bottom of the bottle-shaped trench. When this occurs, subsequent formation of the capacitor dielectric layer covering the sidewalls and trench bottom is hindered by poor uniformity of reaction gas ($AsH_3$) diffusion, regardless of whether formation is achieved by gas phase deposition or ASG doping and also results in current leakage.

SUMMARY OF THE INVENTION

To address the previously described disadvantages, an object of the present invention is to provide a method for forming a bottle-shaped trench. The method comprises filling the bottom of trench using a mask layer to prevent awl-shape formation in the susceptible crystal structure of the silicon semiconductor substrate during wet etching thus maintaining the original trench bottom profile.

An embodiment of the present invention provides a method for controlling the profile of the bottle-shaped trench, comprising providing a semiconductor having a pad layer structure with a trench formed therein, filling the bottom of the trench with a mask layer, etching the semiconductor substrate not covered by the mask layer, and removing the mask layer to form a bottle-shaped trench.

Another embodiment of the present invention provides a trench having a sidewall formed therein. A sidewall protective layer (collar oxide layer) is formed on top of the sidewalls, filling the trench with a mask layer, etching the semiconductor substrate not covered by the mask layer and the sidewall protective layer, and removing the mask layer to form a bottle-shaped trench.

The above mentioned wet etching process forming the bottle-shaped trench comprises filling the trench with de-ionized water to diffuse the etchant therein causing a reaction with the semiconductor substrate to etch portions thereof not covered by the mask layer. The conventional method typically immerses the chip in $NH_4OH+H_2O$ etching solution directly without exposure to de-ionized water. Due to the very fine dimensions of the trench, however, the $NH_4OH+H_2O$ etching solution cannot reach the deep bottom of the trench, resulting in over etching of the top portion of the trench, etch-through to adjacent trenches. Therefore, the profile of the trench is very difficult to control.

The inventive method fills the trench with de-ionized water prior to immersing the trench in $NH_4OH+H_2O$ etching solution. The de-ionized water enables thorough diffusion of etching solution throughout the trench, resulting in effective control of the etching rate, and maintaining the trench bottom profile.

The method of the invention offers the advantages of effective profile control and prevents awl-shape formation. The method additionally provides effective control of the etching rate, thus preventing over-etching during the wet etching process and increasing yield. Moreover, mask layer formation in the trench bottom enables precise control of the depth of the bottle-shaped trench.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION OF THE INVENTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more layers.

First Embodiment

Figure 1A:
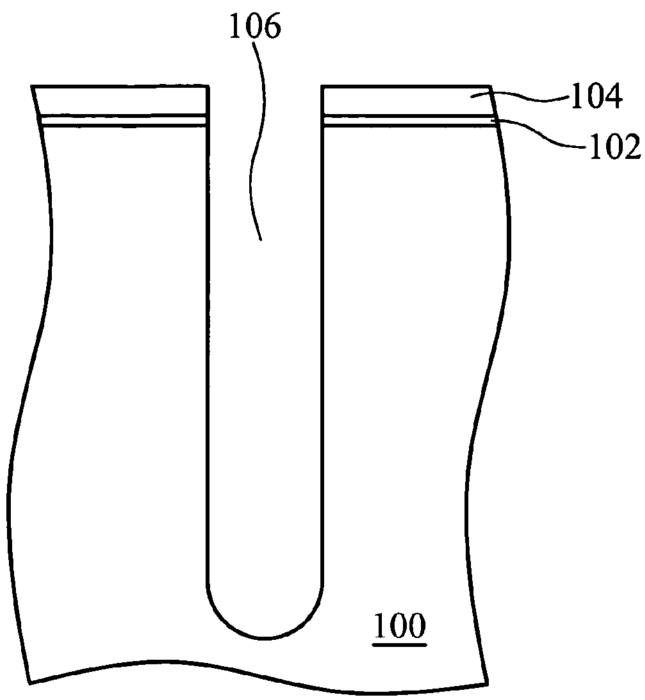
FIGS. 1A~1F are cross sections showing the process of forming the conventional bottle-shaped trench.
Figure 1B:
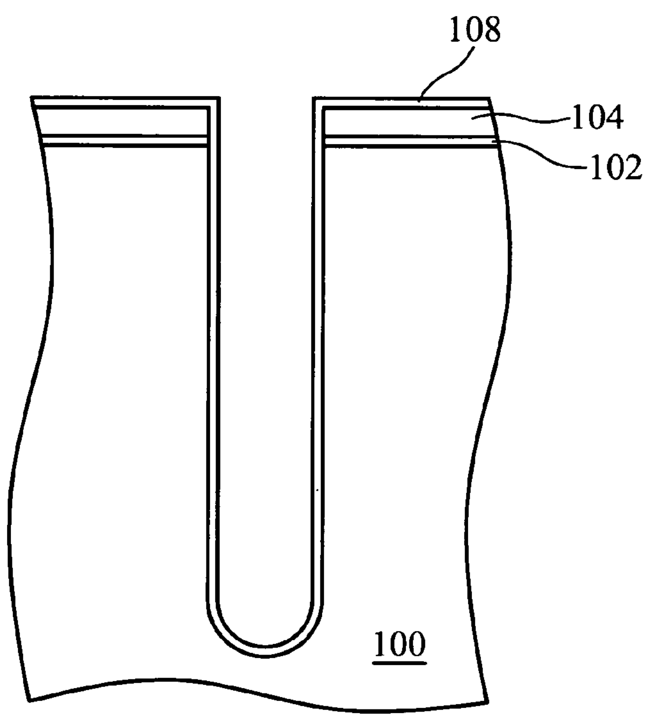
Figure 1C:
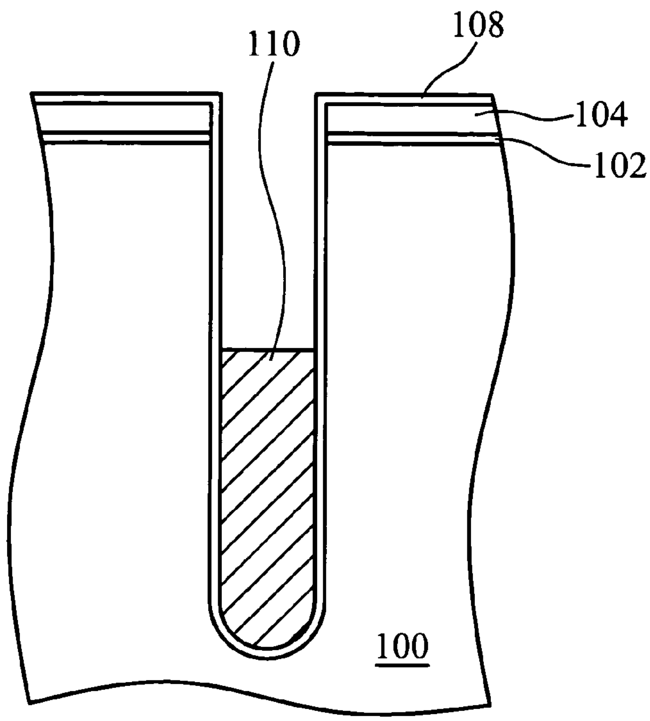
Figure 1D:
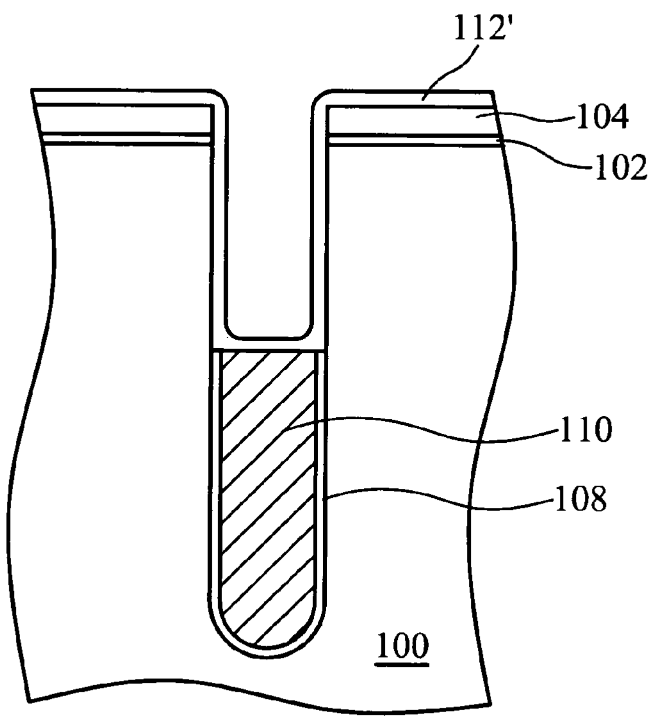
Figure 1E:
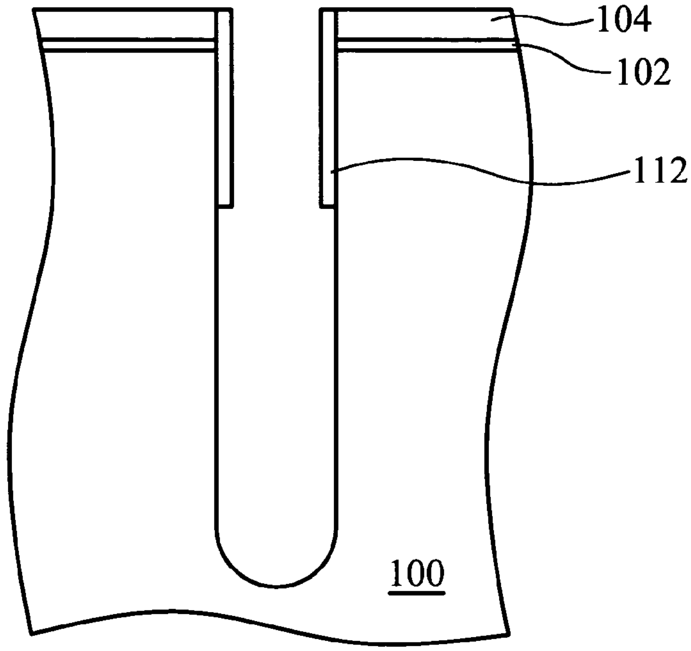
Figure 1F:
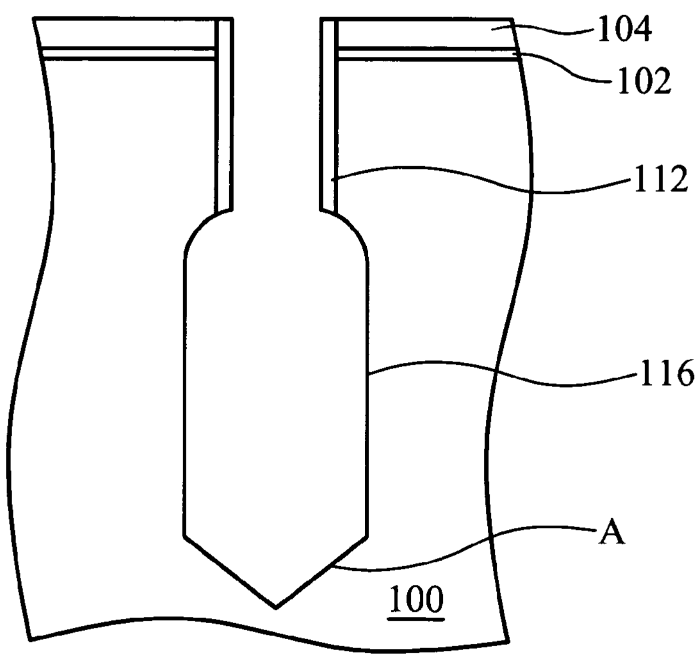
Figure 2A:
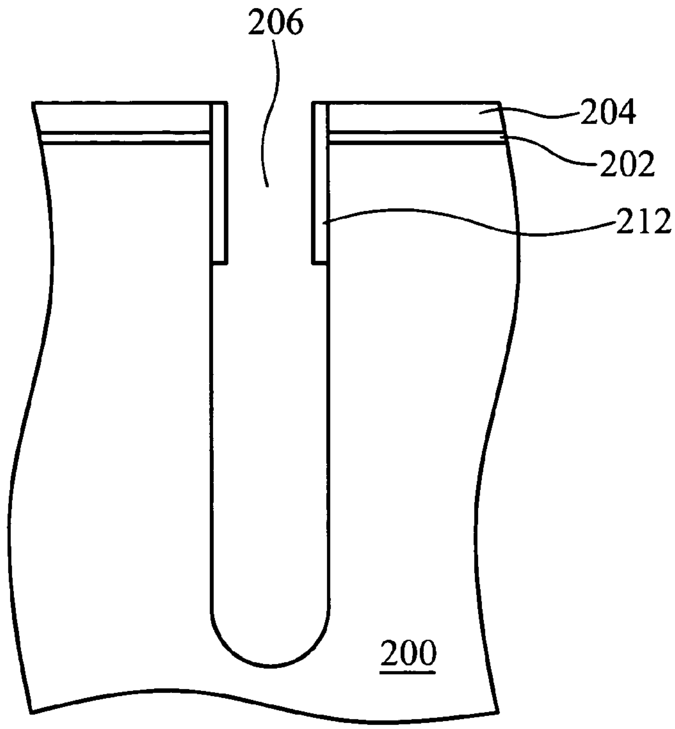
FIGS. 2A~2E are cross sections showing the first embodiment of the present invention.
Figure 2B:
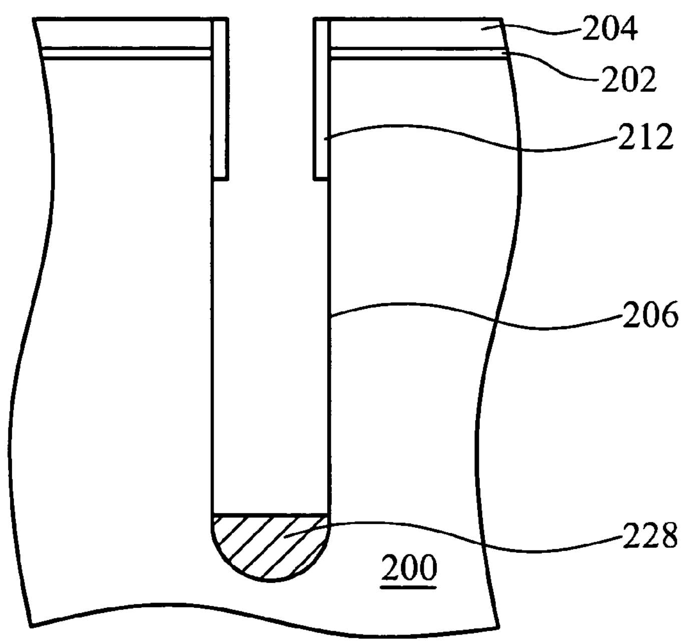

Referring to FIG. 2A, a semiconductor substrate 200 with a pad layer structure (a pad nitride 204 is stacked over a pad oxide 202) and a trench 206 formed thereon is first provided, a sidewall protective layer (collar oxide layer) is formed at the top of the upper sidewalls of the trench to protect the trench from the subsequent wet etching process. Preferably the sidewall protective layer is an oxide layer, formation of which is described in the related art (collar oxide 112) hence its description is omitted here.

A masking material, such as a photoresist, is then deposited formed in the bottom of the trench by spin-coating. The resulting material layer is then etched back to form a masking layer 228 to protect the bottom of the trench. In this embodiment, the mask layer is recessed about 600 nm below the top of the trench but the depth is not restricted to this and may be altered depending on requirements so long as the remaining masking material sufficiently protects the trench bottom.

Figure 2C:
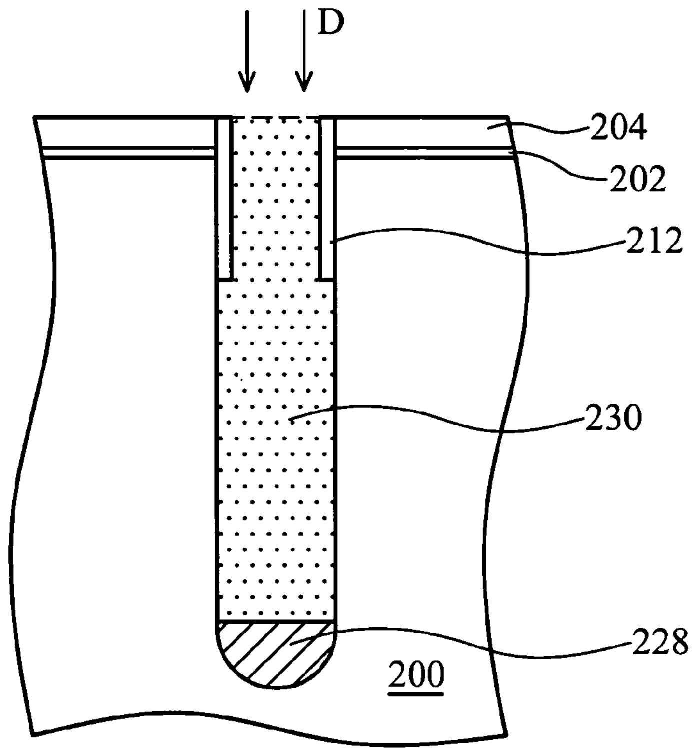

Subsequently, the above mentioned trench 206 is filled with the de-ionized water 230, as shown in FIG. 2C. An etchant, such as $NH_4OH+H_2O$ etching solution, is then added and diffuses (shown as D) throughout the entire trench, thereby etching the semiconductor substrate. Sequentially, the steps of the method comprise filling the trench with de-ionized water, adding the $NH_4OH+H_2O$ etching solution immersing a chip with the above mentioned semiconductor substrate 200 in the de-ionized water, then immersing the chip in an etching solution containing $NH_4OH+H_2O$ etchant.

Figure 2D:
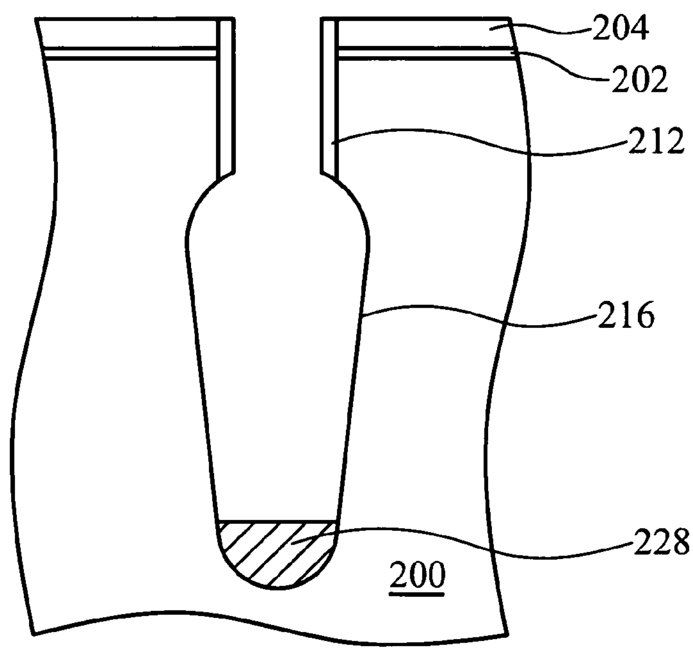

The purpose of the etching steps is to etch portions of the semiconductor substrate not covered by the sidewall protective layer 212 and the mask layer 228 in the trench. Since the sidewall of trench 206 is protected by sidewall protective layer 212, the $NH_4OH+H_2O$ etching solution is thoroughly diffused from the top of the trench to the bottom by the de-ionized water. As with the isotropic etching, the etchant contacts the sidewalls of the trench beside the sidewall protective layer for a longer period of time, resulting in the etched area at the top of the trench being slightly wider than at the bottom and extending the cross-section at the sidewalls of the trench beside the sidewall protective layer 212, as shown in FIG. 2D. The cross section area is tapered toward the bottom of the trench, thus the bottle-shaped trench 216 is obtained.

Figure 2E:
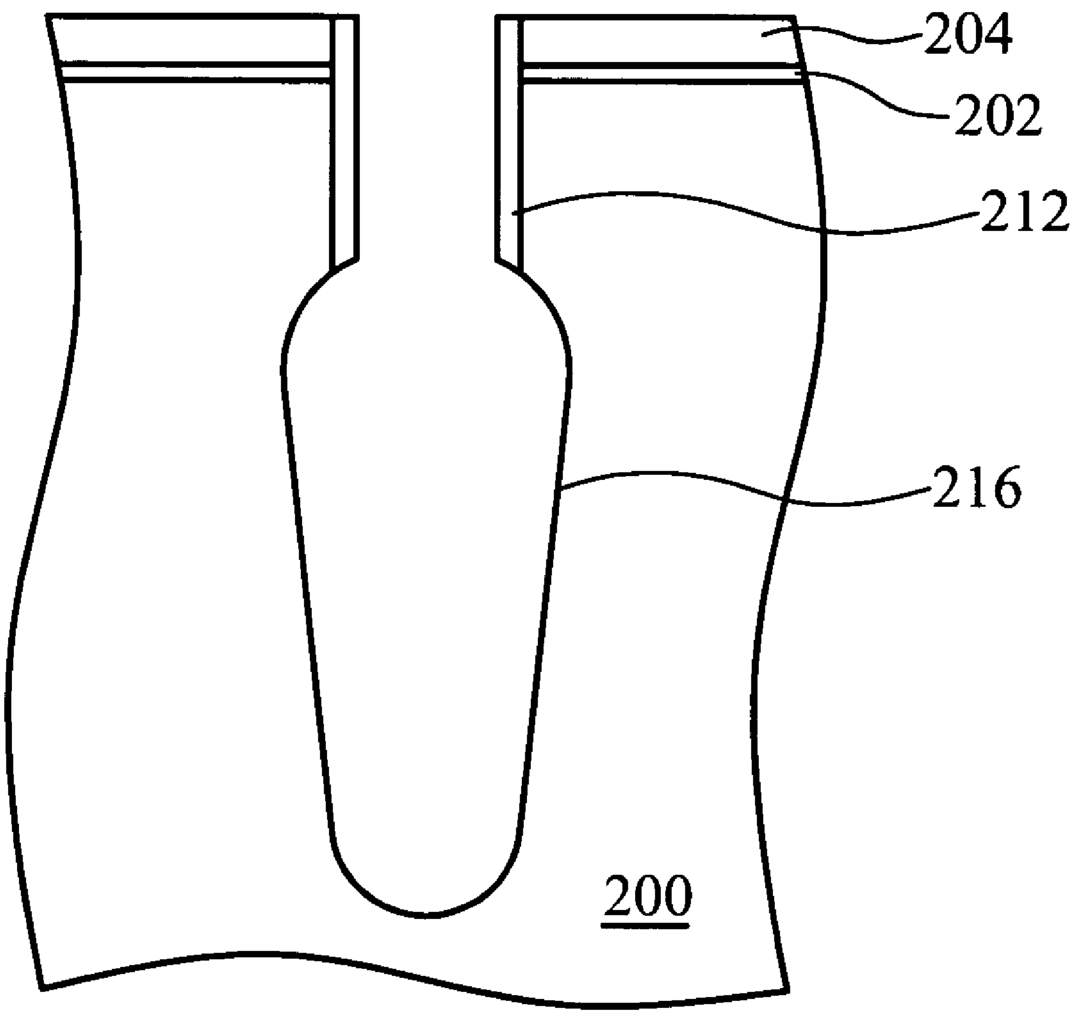

Finally, the mask layer 228 at bottom of the trench, as shown in FIG. 2E, is removed with a solution comprising a mixture of, for example, $H_2SO_4$ and Hydrogen Peroxide to obtain the bottle-shaped trench 216.

In the above embodiment, the original trench bottom profile is maintained during the etching process due to the mask layer 228 and the etching depth is controlled to prevent over-etching. The mask layer is removed after etching, to obtain the bottle-shaped trench, meeting process requirements for both depth and profile, and preventing current leakage arising from awl-shape formation caused by the conventional method.

Additionally, during wet etching using the $NH_4OH+H_2O$, the trench is first filled with de-ionized water to enable thorough diffusion of the $NH_4OH+H_2O$ etching solution throughout the entire trench. Use of de-ionized water effectively controls the etching rate preventing etch-through of adjacent trenches due to the faster etching rate in the upper portion of the trench, by preventing $NH_4OH+H_2O$ etchant from directly filling the dry trench which can result in device damage.

Second Embodiment

Figure 3A:
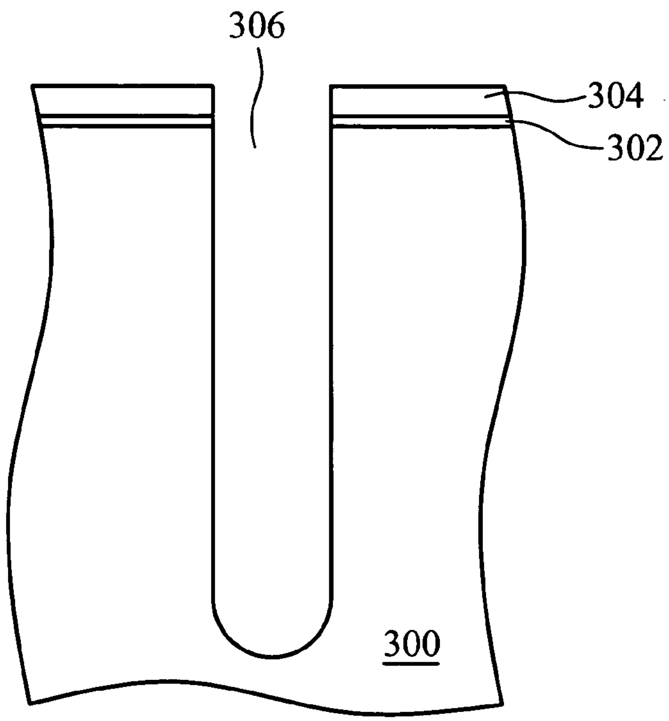
FIGS. 3A~3E are cross sections showing the second embodiment of the present invention.
Figure 3B:
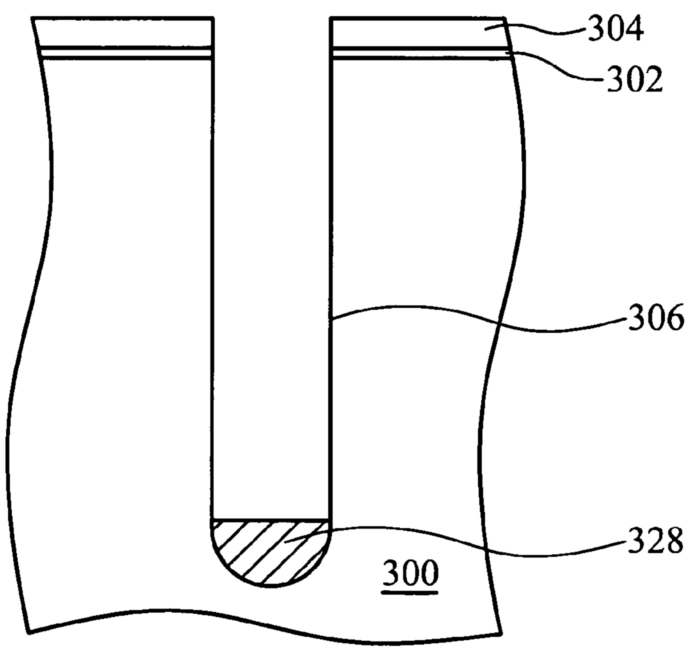

The only difference from the first embodiment is that the second embodiment does not form sidewall protective layer 212, as shown in FIG. 3A. The present invention is also applicable to a trench without sidewall protective layer 212. In practical terms, the extended dimensions of top of the trench are provided to aid in filling the subsequent conductive materials, such as the polysilicon layer, into the trench, preventing formation of a seam on the narrowed trench top filled by a conductive layer, thus enhancing yield.

After formation of the above mentioned trench 306, a masking material, such as a photoresist, is formed in the trench bottom by spin-coating. The layer is then etched back to form a masking layer 328 to protect the bottom of the trench. In this embodiment, the mask layer is recessed about 600 nm below the top of the trench but the depth is not restricted to this and may be altered to meet requirements so long as the remaining masking material sufficiently protects the trench bottom.

Figure 3C:
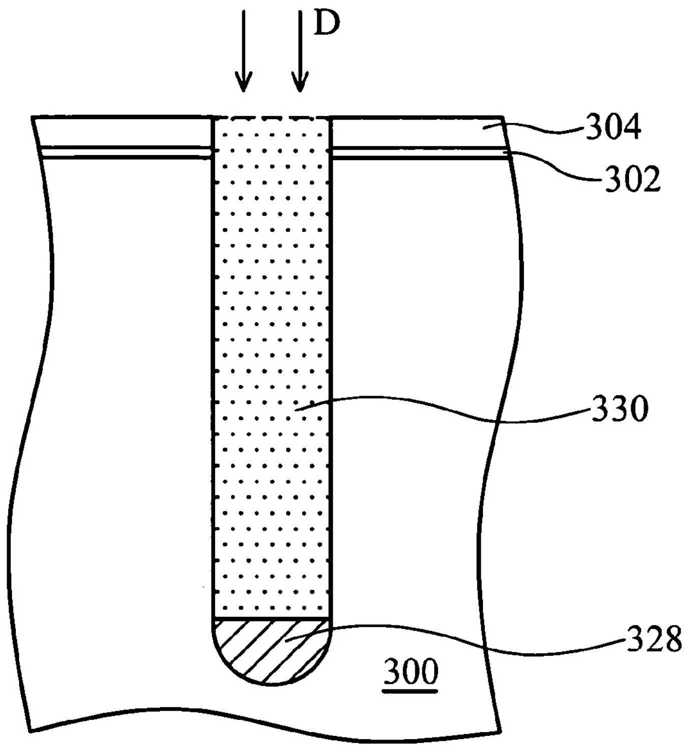

Subsequently, as in the first embodiment, the above mentioned trench 306 is filled with the de-ionized water 330, as shown in FIG. 3C. An etchant, such as $NH_4OH+H_2O$ etching solution, is then added and diffuses (shown as D) throughout the entire trench, thereby etching the semiconductor substrate. Sequentially, the steps of the method comprise filling the trench with de-ionized water, adding the $NH_4OH+H_2O$ etching solution immersing a chip with the above mentioned semiconductor substrate 200 in the de-ionized water, then immersing the chip in an etching solution containing $NH_4OH+H_2O$ etchant.

Figure 3D:
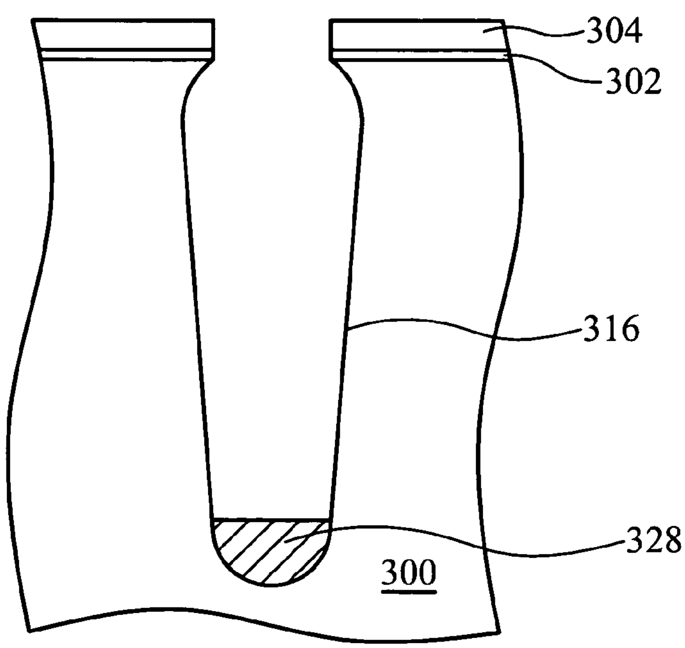

The purpose of the etching steps is to etch portions of the semiconductor substrate of the trench 306 not covered by the mask layer 328. Since there is no sidewall protective layer to protect the trench sidewall 306, the $NH_4OH+H_2O$ etching solution is thoroughly diffused from the top to the bottom of the trench by de-ionized water, so that the semiconductor substrate around the top of the trench is etched first for a longer etching time, so that the etching area at top of the trench is slightly wider than at the bottom, extending to the dimensions shown by the cross section area in FIG. 3D. The cross-section area is tapered toward the bottom of the trench, thus the bottle-shaped trench 316 is obtained.

Figure 3E:
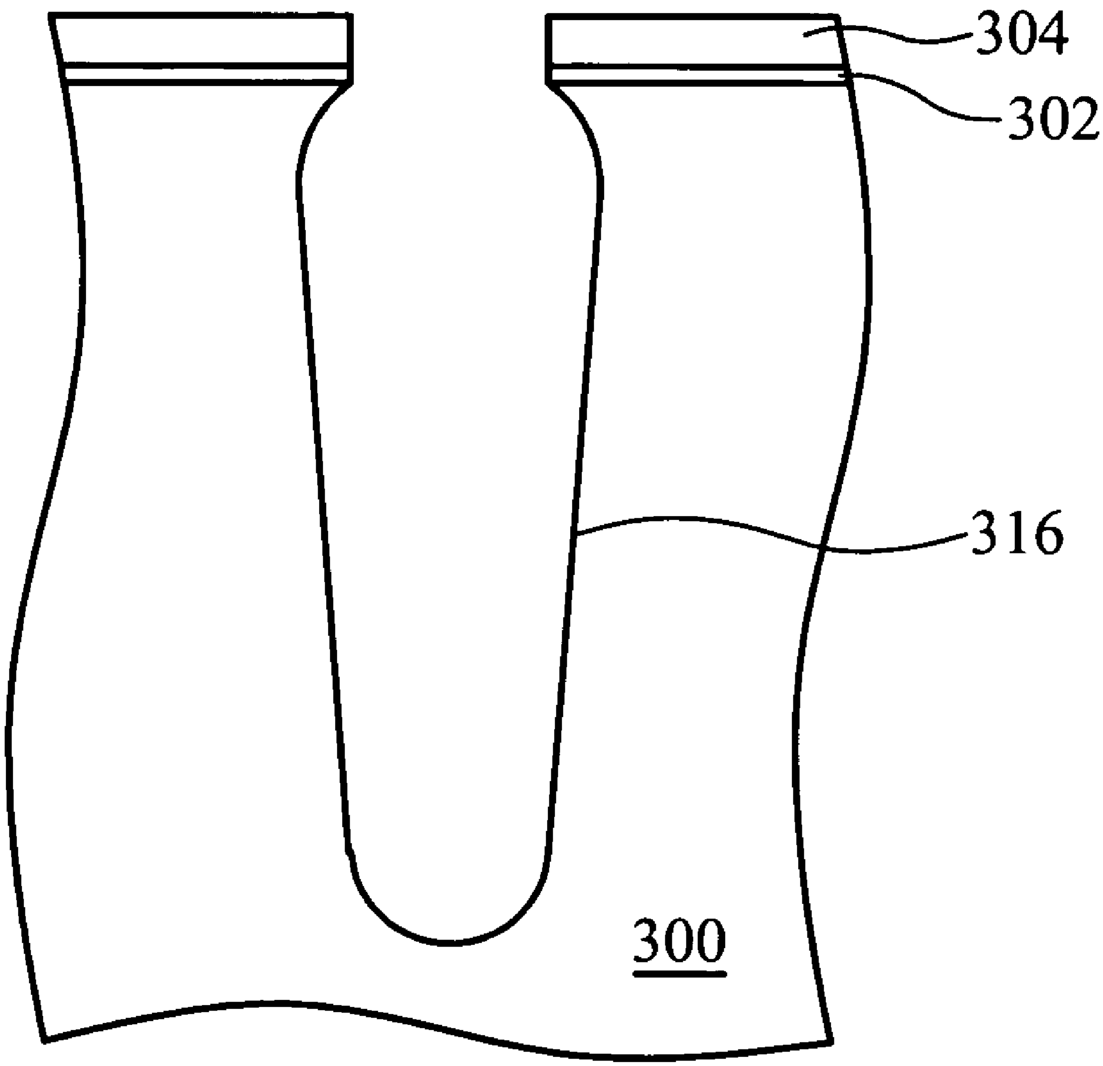

Finally, as in the first embodiment, the mask layer 328 at bottom of the trench, as shown in FIG. 3E, is removed by a solution comprising a mixture of, for example, H2SO4 and Hydrogen Peroxide.

In the second embodiment, formation of the sidewall protective layer is omitted, thus extending the cross section area at the top of the trench. The advantages are the same as those attained by the first embodiment, and included preventing a seam from arising at the top of the narrowed trench thus facilitating the subsequent filling of conductive materials into the trench and further increasing yield.

The method of the present invention for forming bottle-a shaped trench provides the following advantages. Effective control of the trench bottom depth and profile, preventing over-etching of the trench bottom and awl-shape formation, and further preventing poor uniformity of gas diffusion in subsequent capacitor dielectric layer formation. The device is additionally protected from current leakage ensuring excellent performance. Additionally, effective control of the etching rate prevents over-etching and resulting etch-through of adjacent trenches during the wet etching process. Finally, the seam arising from conventional filling of the narrowed trench top with the conductive layer is prevented.

As mentioned above, the method of the invention provides enhanced product performance and increased process yield.

Although the present invention has been particularly shown and described above with reference to the preferred embodiment, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method for forming a bottle-shaped trench comprising the steps of:

providing a substrate having a pad structure and at least one trench therein;

forming a mask layer to fill the bottom of the trench;

filling de-ionized water in the trench;

after filling de-ionized water in the trench diffusing an etchant in the trench by means of the de-ionized water, thereby etching the semiconductor substrate not covered by the masking layer, wherein the mask layer protects the bottom of the trench during the etching; and removing the mask layer to form the bottle-shaped trench.

2. The method of claim 1, wherein the step of filling the de-ionized water in the trench comprises: immersing the semiconductor substrate in the de-ionized water.

3. The method of claim 1, wherein the step of diffusing an etchant in the trench comprises: immersing the semiconductor substrate in an etching solution containing the $NH_4OH+H_2O$ etchant.

4. The method of claim 1, wherein the semiconductor substrate is etched using $NH_4OH+H_2O$ to form the bottle-shaped trench.

5. The method of claim 1, wherein the pad structure comprises a stacked oxide layer and a nitride layer.

6. The method of claim 1, wherein the masking material is photoresist.

7. The method of claim 1, wherein the filling of the mask layer in the trench comprises the steps of:

coating the pad structure with a masking material to fill the trench; and recessing the masking material to a predetermined depth, thus forming a mask layer in the trench.

8. The method of claim 7, wherein the masking material is removed with a solution comprising a mixture of $H_2SO_4$ and Hydrogen Peroxide.

9. The method of claim 1, wherein the trench has a sidewall with a collar oxide layer at the top of the trench, and the semiconductor substrate unmasked by the collar oxide layer is etched in the trench.

10. The method of claim 1, wherein the depth of the mask layer is defined to about 600 nm from the top of the trench.

* * * * *